United States Patent [19]
Fukunaga et al.

[11] Patent Number: 5,375,029
[45] Date of Patent: Dec. 20, 1994

[54] OVERCURRENT PROTECTION CIRCUIT OF POWER DEVICE AND SEMICONDUCTOR INTEGRATED CIRCUIT DEVICE

[75] Inventors: Masanori Fukunaga, Fukuoka; Shigeru Hokuyo, Itami, both of Japan

[73] Assignee: Mitsubishi Denki Kabushiki Kaisha, Tokyo, Japan

[21] Appl. No.: 120,361

[22] Filed: Sep. 14, 1993

[30] Foreign Application Priority Data

Oct. 9, 1992 [JP] Japan ................... 4-271487

[51] Int. Cl.⁵ .................... H02H 3/00; H02H 9/02
[52] U.S. Cl. ......................... 361/101; 361/93; 323/285
[58] Field of Search ............... 361/18, 52, 58, 86–88, 361/91, 93, 94, 98, 100, 101, 103, 106, 97, 28, 30, 29, 31; 323/265, 266, 274–277, 281, 283, 285, 311, 312, 901, 907, 908; 363/49, 56, 58

[56] References Cited

U.S. PATENT DOCUMENTS

| | | | |
|---|---|---|---|
| 4,736,267 | 4/1988 | Karlmann et al. | 361/101 |
| 4,896,245 | 1/1990 | Qualich | 361/103 |
| 5,111,123 | 5/1992 | Hach et al. | 361/30 |

FOREIGN PATENT DOCUMENTS 2-130951  5/1990  Japan .
4-79758   3/1992  Japan .

*Primary Examiner*—Jeffrey A. Gaffin
*Assistant Examiner*—Ronald W. Leja
*Attorney, Agent, or Firm*—Oblon, Spivak, McClelland, Maier, & Neustadt

[57] ABSTRACT

In an overcurrent protection circuit of a power device, an analog switch (4) connects a negative input of a comparator (3) to a reference voltage VREF1 or another reference voltage VREF2 depending on a control signal (S5) from a timer (5). A positive input of the comparator (3) receives voltage drop value (VS). The timer (5) is triggered by a leading edge of an input signal (IN) to output the control signal (S5) to the analog switch (4). The control signal (S5) directs the analog switch (4) to connect the reference voltage VREF2 to the negative input of the comparator (3) only during a transient state estimated period (T) and to connect the reference voltage VREF1 to the negative input of the comparator (3) out of the transient state estimated period (T).

15 Claims, 13 Drawing Sheets

F I G. 1
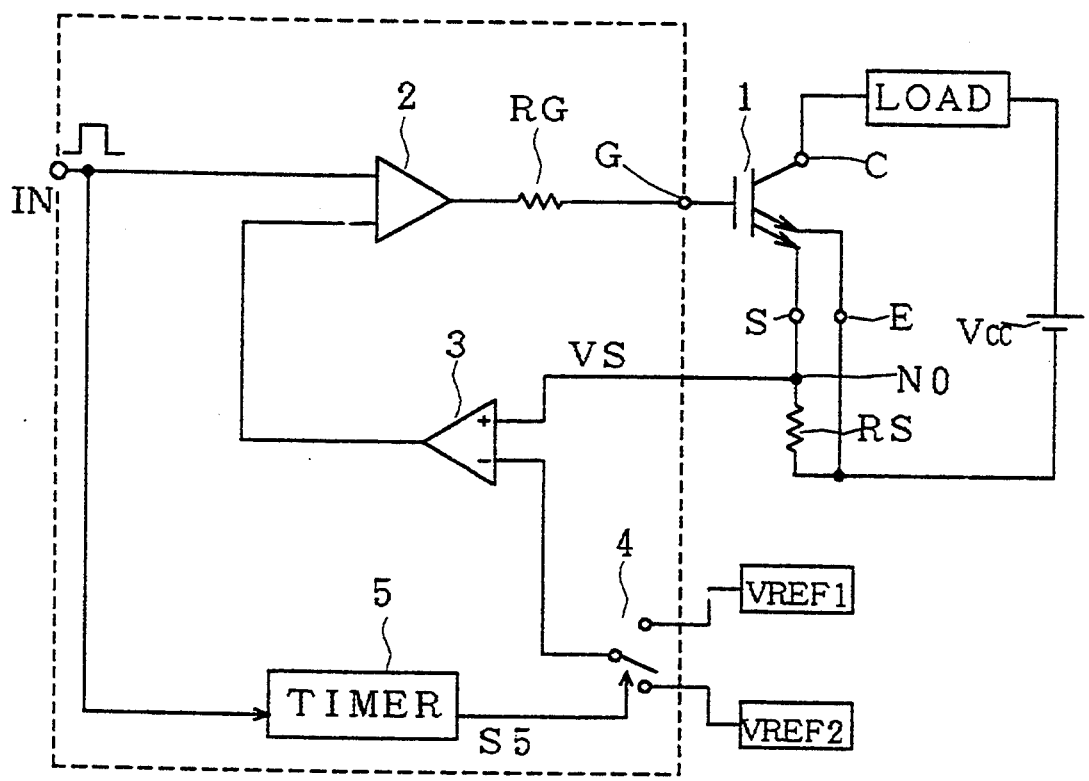

OVERCURRENT PROTECTION CIRCUIT OF POWER DEVICE AND SEMICONDUCTOR INTEGRATED CIRCUIT DEVICE

BACKGROUND OF THE INVENTION

1. Field of the Invention

The present invention relates to an overcurrent protection circuit of a power semiconductor device having a current sensing electrode.

2. Description of the Background Art

FIG. 11 is a circuit diagram showing a configuration of a conventional overcurrent short-circuit protection circuit of an IGBT (Insulated Gate Bipolar Transistor) having a current sense (current sensing terminal). As shown in FIG. 11, an N-channel current sense IGBT 1 has a collector (C) connecting to a positive (+) terminal of a power supply $V_{cc}$ through a load LOAD, an emitter (E) connecting to a negative (−) terminal of the power supply $V_{cc}$ and a gate (G) terminal connecting to an output of a driver 2 through a gate resistance RG. Further, a current sensing resistance RS is connected between a sense (S) terminal and the emitter (E) terminal of the IGBT 1. The amount of the sense current flowing through the sense terminal is in proportion to that of the emitter current (=collector current $I_c$) flowing through the emitter terminal.

The current sensing resistance RS has a node N10 on the side of the sense terminal connecting to a positive input of a comparator 3. In other words, the value of voltage drop VS across the current sensing resistance RS is fed to the positive input of the comparator 3. The comparator 3 has a reference voltage VREF1 applied to its negative input. An output of the comparator 3 is applied to an input of the driver 2. The driver 2 is thereby controlled whether to be active or non-active depending on whether the output of the comparator 3 is L-level or H-level, respectively.

The driver 2 outputs an input signal IN to the IGBT 1 when it is active while it outputs thereto an L-level signal which works to turn off the IGBT 1 when non-active.

A current detection of the IGBT 1 is conducted by the comparator 3 through comparing the voltage drop value VS across the current sensing resistance RS with the reference voltage VREF1. When the relation VS>VREF1 is satisfied, the output of the comparator 3 becomes H-level to be fed back to the input of the driver 2. In consequence, the output of the driver 2 becomes L-level to turn off the IGBT 1. Accordingly, the current supply of the IGBT 1 is cut off to thereby avoid keeping the IGBT 1 in an overcurrent supply condition. Thus, the IGBT 1 is protected from falling into a latch-up condition.

The IGBT incorporating a current sense has a characteristic that the ratio of the sense current to the emitter current becomes larger when the gate voltage immediately after its turn-on is close to $V_{th}$ (a threshold voltage) because of feedback capacitance, as compared with when enough voltage is applied to the gate voltage.

FIG. 12 gives three timing charts showing a gate voltage $V_{GE}$, collector currents $I_c$ and voltage drop values VS across the current sensing resistance RS of the IGBT incorporating a current sense at its turn-on time. In the figure, the period t immediately after its turn-on is a transition period in which the gate voltage is remaining close to the threshold value $V_{th}$. During the period t, waveforms of the voltage drop values VS highly surge up, as compared with those of collector currents ($I_c$=emitter currents). Therefore, in the case of waveform b, though the collector current $I_c$ is always equal to or less than the overcurrent level OI, the relation VS>VREF1 disadvantageously holds because of the surge of the voltage drop value VS during the transition period t, to thereby cause a mistaken detection that the IGBT is in an overcurrent condition.

FIG. 13 is a circuit diagram showing a configuration of a conventional overcurrent protection circuit of the IGBT incorporating a current sense tier preventing the above mistaken detection. As shown in the figure, a capacitor CS is connected in parallel with the current sensing resistance RS. In the circuit, the current sensing resistance RS and the capacitor CS connected thereto in parallel work as a low-pass filter for preventing the mistaken detection (malfunction).

Accordingly, by setting the time constant of the filter to be sufficiently larger than the threshold state maintaining period t of the gate voltage $V_{GE}$ to sufficiently soften the surge of the waveform of the voltage drop value VS immediately after the turn-on of the IGBT 1, the voltage drop value VS of the IGBT 1 in normally operation can always satisfy the relation VS<VREF1 even during the threshold state maintaining period t. In consequence, the IGBT 1 is not detected mistakenly being in an overcurrent condition immediately after its turn-on.

According to the configuration of FIG. 13, however, since the voltage drop value VS after being filtered is taken in through the positive input of the comparator 3, when the IGBT incorporating a current sense actually falls into an overcurrent and short-circuit condition while holding the relation VS>VREF1, a time-lag for the filtering time disadvantageously occurs before breaking the IGBT, so that the IGBT can not be protected promptly and at the worst may break down.

SUMMARY OF THE INVENTION

The present invention is directed to a circuit for protecting a semiconductor device from overcurrent.

According to the present invention, the circuit comprises: (a) detector means tier detecting a turning-on transition period of the semiconductor device; and (b) monitoring means for monitoring a current flowing through the semiconductor device to turn-off the semiconductor device; when the current becomes larger than a first overcurrent level during time period other than the transition period, and when the current becomes larger than a second overcurrent level in the transition period.

The second overcurrent level is lower than the first overcurrent level.

According to the present invention, the semiconductor device such as a power device is disenabled when the level of a sensing signal for monitoring the main current of the semiconductor device exceeds relatively high reference level during the turning-on transition period. After the turning-on period, the semiconductor device is disenabled when the level of the sensing signal exceeds relatively low reference level. Thus, it is prevented that the semiconductor device is turned-off by the overshoot caused only in the sensing signal during the turning-on transition period of the semiconductor device.

Supposing that the current flowing through the semiconductor device is represented by the sensing signal VS and the first and second overcurrent levels are VR1 and VR2, respectively, the condition of enabling the semiconductor device in the present invention is:

i) VS>VR1: for time periods other than the transition period; and VS>VR2: for the transition period.

This condition is equivalent to the condition of:

ii) VS−(VR1−VR0)>VR0
   VS−(VR2−VR0)>VR0 where VR0 is an arbitrary voltage value.

When the first condition i) is directly employed, the sensing signal or an objective signal VS is compared with two reference levels VREF1=VR1 and VREF2=VR2. On the other hand, when the second condition ii) is employed, two objective signals VS1=VS−(VR1−VR0) and VS2=VS−(VR2−VR0) are defined and are compared with a one reference level VREF1=VR0.

In other words, the present invention may be embodied by the combination of:

(one objective signal+two reference signals); or
(two objective signals+one reference signal).

Respective preferred embodiments corresponding to these variations will be described later in more detail.

Accordingly, an object of the present invention is to protect a semiconductor device from overcurrent without causing decrease in operation accuracy and operation speed.

Another object is to preventing turning-off of a power device during regular operation thereof.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram showing a configuration of an overcurrent protection circuit of an IGBT in accordance with a first preferred embodiment of the present invention;

DESCRIPTION OF THE PREFERRED EMBODIMENTS

Figure 2:
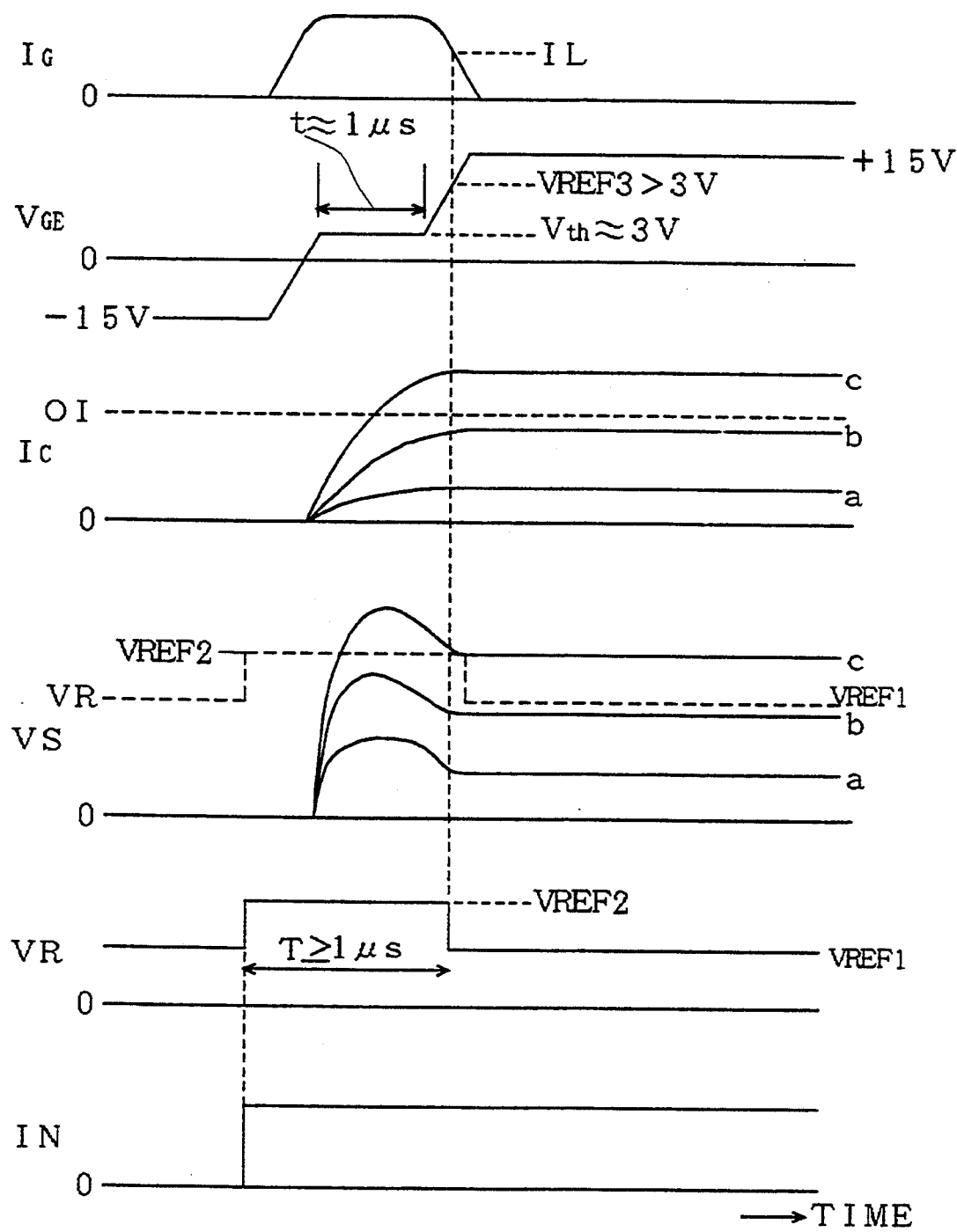
FIG. 2 shows operational timing charts in accordance with the preferred embodiments of the present invention.

FIG. 1 is a circuit diagram showing a configuration of an overcurrent protection circuit of an IGBT (Insulated Gate Bipolar Transistor) in accordance with the first preferred embodiment of the present invention.

As shown in FIG. 1, a semiconductor power device or a current sense IGBT 1 has a collector (C) connecting to a positive (+) terminal of a power supply $V_{cc}$ through a load LOAD, an emitter (E) connecting to a negative (−) terminal of the power supply $V_{cc}$ and a gate (G) terminal connecting to an output of a driver 2 through a gate resistance RG. Further, a current sensing resistance RS is connected between a sense (S) terminal and the emitter (E) terminal of the IGBT 1. A node N0 between the sense terminal and the current sensing resistance RS of the IGBT 1 is connected to a positive input of a comparator 3, so that a voltage drop value VS across the current sensing resistance RS is taken in to the positive input of the comparator 3.

An analog switch 4, which is connected to a negative input of the comparator 3, receives a control signal or a one-shot pulse S5 from a timer 5 and connects the negative input of the comparator 3 with a reference voltage VREF1 or VREF2 depending on the control signal S5. The reference voltage VREF1 is a voltage indicating the overcurrent protection level of the IGBT 1 in a stationary state while the reference voltage VREF2 (>VREF1) indicates the overcurrent protection level of the IGBT 1 in a transient state immediately after its turn-on. These reference voltages VREF1 and VREF2 are generated by a reference voltage applying means not shown, which is provided inside the circuit and connected to the power supply line.

The timer 5 takes in an input signal IN, and is triggered by the leading edge of the input signal IN to output a control signal S5 directing the analog switch 4 to connect with the reference voltage VREF2 only during the transient state estimated period T in which the IGBT 1 is regarded as in a transient state immediately after its turn-on. Out of the transient state estimated period T, when the IGBT 1 is regarded as in a stationary state, the timer 5 outputs a control signal S5 directing the analog switch 4 to connect with the reference voltage VREF1.

Further, the transient state estimated period T of the timer 5 is set from the turn-on of the input signal IN until the gate voltage of the IGBT 1 is estimated to become enough larger than its threshold voltage $V_{th}$ based on its feedback capacitance. The period T may be determined by experiments in which the gate voltage is monitored after turning-on of the input signal IN.

In addition, an integration circuit comprising a resistance and a capacitor and having an RC time constant or the like could be used for the internal configuration of the timer 5.

In this configuration, when the timer 5 regards the IGBT 1 as in a stationary state, the current detection thereof is conducted, like a conventional one, by the comparator 3 through comparing the voltage drop value VS across the current sensing resistance RS with the reference voltage VREF1. When VS>VREF1, the output of the comparator 3 becomes H-level to be fed back to the input of the driver 2. Consequently, the L-level output of the driver 2 turns off the IGBT to break the overcurrent supply of the IGBT 1. Thus, the IGBT 1 can be protected from falling into a latch-up condition.

On the other hand, when the timer 5 regards the IGBT 1 as in a transient state immediately after its turn-on, the current detection thereof is conducted by the comparator 3 through comparing the voltage drop value VS across the current sensing resistance RS with the reference voltage VREF2. When VS>VREF2, the output of the comparator 3 becomes H-level to be fed back to the input of the driver 2. Consequently, the L-level output of the driver 2 turns off the IGBT to break the overcurrent supply of the IGBT 1. Thus, the IGBT 1 can be protected from falling into a latch-up condition.

FIG. 2 shows a protection operation of the overcurrent protection circuit the IGBT in accordance with the first preferred embodiment. The figure gives a gate current represented by $I_G$, a gate voltage $V_{GE}$, collector currents $I_c$, voltage drop values VS across current sensing resistances RS, a reference voltage VR applied to the negative input of the comparator 3 and an input signal IN.

As shown in the figure, during the transient state estimated period T from the turn-on of the input signal IN until the gate voltage $V_{GE}$ becomes enough larger than the threshold voltage $V_{th}$, the reference voltage VREF2 is applied to the negative input of the comparator 3. During the transient state estimated period T, the IGBT 1 is regarded as in a transient state by the overcurrent protection circuit of the IGBT in accordance with the first preferred embodiment.

Accordingly, in the case of waveform b, since the voltage drop value VS is over the reference voltage VREF1 but under the reference voltage VREF2 during the transient state estimated period T, the output of the comparator 3 becomes L-level, so that the IGBT is not detected being in an overcurrent condition. In other words, it is possible to avoid a mistaken detection which might be made when the voltage drop value VS exceeds the reference voltage VREF1 during the transient state estimated period T although the collector current $I_c$ is under the overcurrent level OI.

In the case of waveform c, since the voltage drop value VS exceeds the reference voltage VREF2 also during the transient state estimated period T, the output of the comparator 3 becomes H-level, so that the IGBT is detected being in an overcurrent condition. From that the voltage drop value VS with respect to the waveform c in a stationary state is over the reference voltage VREF1, a correct detection is made during the transient state estimated period T that the IGBT with respect to the waveform c is in an overcurrent condition.

Thus, the overcurrent protection circuit of the IGBT in accordance with the first preferred embodiment can fulfill its overcurrent protection function accurately for the IGBT 1 even at its turn-on by setting the reference voltage VREF2 used for the comparison with the voltage drop value VS during the transient state period at the turn-on larger than the reference voltage VREF1 used for the comparison with the voltage drop value VS in a stationary state. Moreover, the overcurrent protection operation is performed without using such a means as a filter circuit that deteriorates signal responsivity, to thereby avoid a time-lag.

Figure 3:
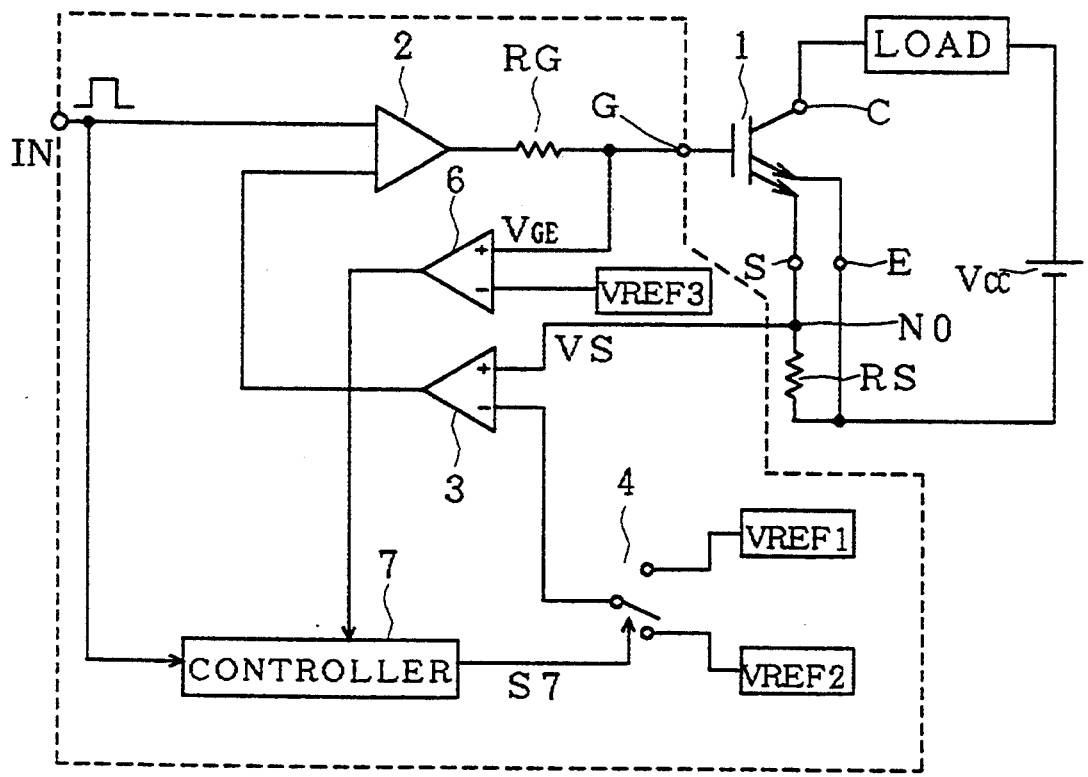
FIG. 3 is a circuit diagram showing a configuration of an overcurrent protection circuit of the IGBT in accordance with a second preferred embodiment of the present invention.

FIG. 3 is a circuit diagram showing a configuration of an overcurrent protection circuit of the IGBT in accordance with the second preferred embodiment of the present invention.

As shown in the figure, a current sense IGBT 1 has a collector (C) connecting to a positive (+) terminal of a power supply $V_{cc}$ through a load LOAD, an emitter (E) connecting to a negative (−) terminal of the power supply $V_{cc}$ and a gate (G) terminal connecting to an output of a driver 2 through a gate resistance RG. Further, a current sensing resistance RS is connected between a sense (S) terminal and the emitter (E) terminal of the IGBT 1. A node N0 between the sense terminal and the current sensing resistance RS of the IGBT 1 is connected to a positive input of a comparator 3, so that a voltage drop value VS across the current sensing resistance RS is taken in to the positive input of the comparator 3.

An analog switch 4, which is connected to a negative input of the comparator 3, receives a control signal S7 from a controller or a pulse generator 7 and connects the negative input of the comparator 3 with a reference voltage VREF1 or VREF2 depending on the level of the control signal S7. The reference voltage VREF1 is a voltage indicating the overcurrent protection level of the IGBT 1 in a stationary state while the reference voltage VREF2 (>VREF1) indicates the overcurrent protection level of the IGBT 1 in a transient state immediately after its turn-on. These reference voltages VREF1 and VREF2 are generated by a reference voltage applying means not shown, which is provided inside the circuit and connected to the power supply line.

The gate voltage $V_{GE}$ provided by the gate terminal of the IGBT 1 is monitored to a positive input of a comparator 6. A reference voltage VREF3 is inputted to a negative input of the comparator 6. The reference voltage VREF3 is enough larger than the threshold voltage $V_{th}$ of the IGBT 1 and smaller than an H-level voltage. An output of the comparator 6 is applied to the controller 7. The reference voltage VREF3 is generated by the reference voltage applying means not shown, which is provided inside the circuit and connected to the power supply line.

The controller 7 takes in an input signal IN and the output of the comparator 6, and is triggered by the leading edge of the input signal IN to output the control signal S7 directing the analog switch 4 to connect with the reference voltage VREF2 only during the transient state estimated period T in which the IGBT 1 is regarded as in a transient state immediately after its turn-on. Out of the transient state estimated period T, when the IGBT 1 is regarded as in a stationary state, the controller 7 outputs the control signal S7 directing the analog switch 4 to connect with the reference voltage VREF1.

Further, the transient state estimated period T of the controller 7 is a period from the turn-on of the input signal IN until the output of the comparator 6 rises to H-level.

In addition, a flip-flop circuit which is triggered to set by the turn-on of the input signal IN and to reset by the rise to H-level of the output of the comparator 6 or the like is possible for the internal configuration of the controller 7.

In this configuration, when the controller 7 regards the IGBT 1 as in a stationary state, the current detection thereof is conducted, like the first preferred embodiment, by the comparator 3 through comparing the voltage drop value VS across the current sensing resistance RS with the reference voltage VREF1. When VS>VREF1, the output of the comparator 3 becomes H-level to be fed back to the input of the driver 2. Consequently, the L-level output of the driver 2 turns off the IGBT to break the overcurrent supply of the IGBT 1. Thus, the IGBT 1 can be protected from falling into a latch-up condition.

On the other hand, when the controller 7 regards the IGBT 1 as in a transient state immediately after its turn-on, the current detection thereof is conducted by the comparator 3 through comparing the voltage drop value VS across the current sensing resistance RS with the reference voltage VREF2. When VS>VREF2, the output of the comparator 3 becomes H-level to be fed back to the input of the driver 2. Consequently, the L-level output of the driver 2 turns off the IGBT to break the overcurrent supply of the IGBT 1. Thus, the IGBT 1 can be protected from falling into a latch-up condition.

As shown in FIG. 2, during the transient state estimated period T from the turn-on of the input signal IN until the gate voltage $V_{GE}$ exceeds the reference voltage VREF 3 which is enough larger than the threshold voltage $V_{th}$ and the output of the comparator 6 rises to H-level, the reference voltage VREF2 is applied to the negative input of the comparator 3. During the transient state estimated period T, the IGBT 1 is regarded as in a transient state by the overcurrent protection circuit of the IGBT in accordance with the second preferred embodiment.

Thus, the overcurrent protection circuit of the IGBT in accordance with the second preferred embodiment, like the first preferred embodiment, can fulfill its overcurrent protection function accurately for the IGBT 1 even during the transition period immediately after its turn-on by setting the reference voltage VREF2 used for the comparison with the voltage drop value VS during the transient state period at the turn-on larger than the reference voltage VREF1 used for the comparison with the voltage drop value VS in a stationary state. Moreover, the overcurrent protection operation is performed without using such a means as a filter circuit that deteriorates a signal responsivity, to thereby avoid a time-lag.

The transient state estimated period T requires that it should be set longer than the threshold state maintaining period t in which the gate voltage $V_{GE}$ keeps equal to the threshold voltage $V_{th}$ because of its feedback capacitance Since the period t varies with the value of the gate resistance RG, line capacity of the IGBT 1 and the temperature and so forth, it is desirable to vary the transient state estimated period T.

By contrast, in the second preferred embodiment, the transient state estimated period T is obtained by actually monitoring the gate voltage $V_{GE}$. Therefore, if the threshold state maintaining period t varies with the value of the gate voltage RG, the capacity of the IGBT 1 and the temperature and so forth, the transient state estimated period T may vary in response to the variation.

In consequence, it becomes possible to always obtain the transient state estimated period T most adjustable to the threshold state maintaining period t, thereby insuring an overcurrent protection circuit of the IGBT having an overcurrent protection function of higher accuracy, as compared with the first preferred embodiment.

Figure 4:
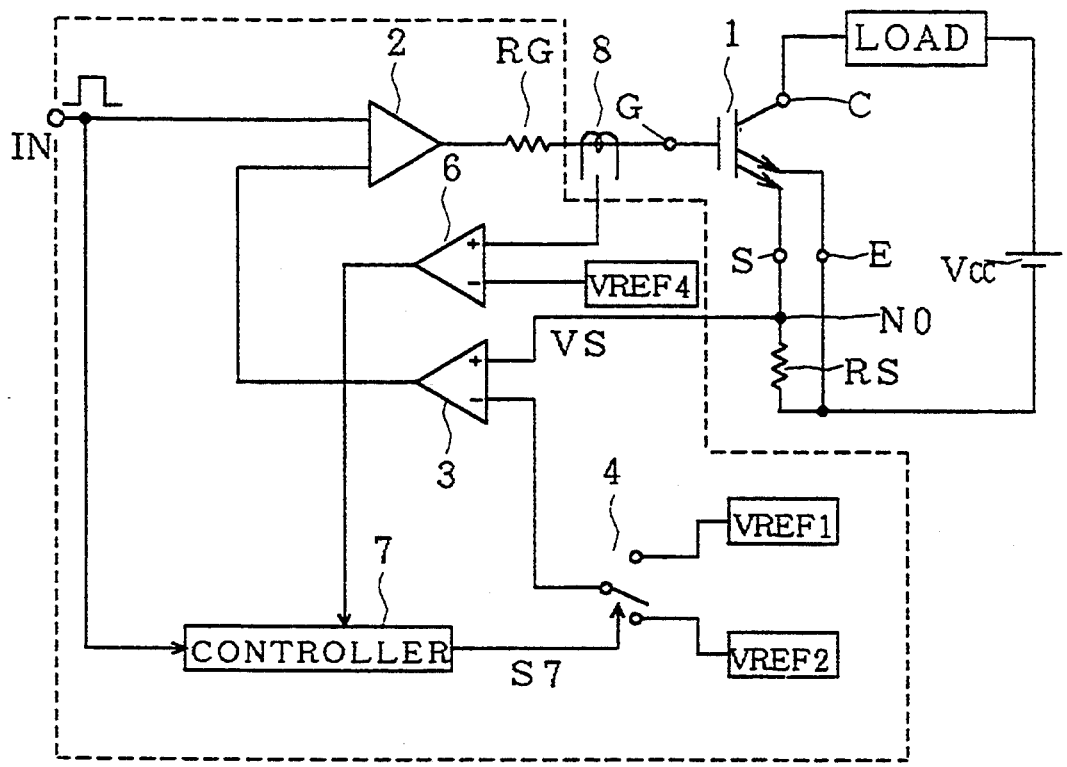
FIG. 4 is a circuit diagram showing a configuration of an overcurrent protection circuit of the IGBT in accordance with a third preferred embodiment of the present invention.

FIG. 4 is a circuit diagram showing a configuration of an overcurrent protection circuit of the IGBT in accordance with the third preferred embodiment of the present invention.

As shown in the figure, a current sense IGBT 1 has a collector (C) connecting to a positive (+) terminal of a power supply $V_{cc}$ through a load LOAD, an emitter (E) connecting to a negative (−) terminal of the power supply $V_{cc}$ and a gate (G) terminal connecting to an output of a driver 2 through a gate resistance RG. Further, a current sensing resistance RS is connected between a sense (S) terminal and the emitter (E) terminal of the IGBT 1. A node N0 between the sense terminal and the current sensing resistance RS of the IGBT 1 is connected to a positive input of a comparator 3, so that a voltage drop value VS across the current sensing resistance RS is taken in to the positive input of the comparator 3.

An analog switch 4, which is connected to a negative input of the comparator 3, receives a control signal S7 from a controller 7 and connects the negative input of the comparator 3 with a reference voltage VREF1 or VREF2 depending on the control signal S7. The reference voltage VREF1 is a voltage indicating the overcurrent protection level of the IGBT 1 in a stationary state while the reference voltage VREF2 (>VREF1) indicates the overcurrent protection level of the IGBT 1 in a transient state immediately after its turn-on.

These reference voltages VREF1 and VREF2 are generated by a reference voltage applying means not shown, which is provided inside the circuit and connected to the power supply line.

A gate current $I_G$ of the IGBT 1 is converted by a current/voltage convertor 8 into a voltage to be monitored to a positive input of a comparator 6. A reference voltage VREF4 is inputted to a negative input of the comparator 6. When the gate current $I_G$ falls to a small current value IL, the current/voltage convertor 8 outputs a voltage equal to the reference voltage VREF4 through current/voltage conversion of the gate current $I_G$. An output of the comparator 6 is applied to the controller 7. The reference voltage VREF4 is generated by the reference voltage applying means not shown, which is provided inside the circuit and connected to the power supply line.

The controller 7 receives an input signal IN and the output of the comparator 6, and is triggered by the leading edge of the input signal IN to output a control signal S7 directing the analog switch 4 to connect to reference voltage VREF 2 only during the transient state estimated period T in which the IGBT 1 is regarded as in a transient state immediately after its turn-on. Other than in the transient state estimated period T, when the IGBT 1 is regarded as in a stationary state, the controller 7 outputs a control signal S7 directing the analog switch 4 to connect with the reference voltage VREF1.

Further, the transient state estimated period T of the controller 7 is a period from the turn-on of the input signal IN until the output of the comparator 6 rises to H-level.

In addition, a flip-flop circuit which is triggered to set by the turn-on of the input signal IN and to reset by the rise to H-level of the output of the comparator 6 or the like is possible for the internal configuration of the controller 7.

In this configuration, when the controller 7 regards the IGBT 1 as in a stationary state, the current detection thereof is conducted, like the first preferred embodiment, by the comparator 3 through comparing the voltage drop value VS across the current sensing resistance RS with the reference voltage VREF1. When VS>VREF1, the comparator 3 outputs an H-level to be fed back to the input of the driver 2. Consequently, the L-level output of the driver 2 turns off the IGBT to break the overcurrent supply of the IGBT 1. Thus, the IGBT 1 can be protected from falling into a latch-up condition.

On the other hand, when the controller 7 regards the IGBT 1 as in a transient state immediately after its turn-on, the current detection thereof is conducted by the comparator 3 through comparing the voltage drop value VS across the current sensing resistance RS with the reference voltage VREF2. When VS>VREF2, the output of the comparator 3 becomes H-level to be fed back to the input of the driver 2. Consequently, the L-level output of the driver 2 turns off the IGBT to break the overcurrent supply of the IGBT 1. Thus, the IGBT 1 can be protected from falling into a latch-up condition.

As shown in FIG. 2, during the transient state estimated period T from the turn-on of the input signal IN until the feedback capacitance of the IGBT 1 is almost completely charged and the gate current $I_G$ falls below the small current value IL in the vicinity of 0 and the output of the comparator 6 falls to L-level, the reference voltage VREF2 is applied to the negative input of the comparator 3. During the transient state estimated period T, the IGBT 1 is regarded as in a transient state by the overcurrent protection circuit of the IGBT in accordance with the third preferred embodiment.

Thus, the overcurrent protection circuit of the IGBT in accordance with the third preferred embodiment, like the first preferred embodiment, can fulfill its overcurrent protection function accurately for the IGBT 1 even at its turn-on by setting the reference voltage VREF2 used for the comparison with the voltage drop value VS during the transient state period at the turn-on larger than the reference voltage VREF1 used for the comparison with the voltage drop value VS in a stationary state. Moreover, the overcurrent protection operation is performed without using such a means as a filter circuit that deteriorates a signal responsivity, to thereby avoid a time-lag.

In the third preferred embodiment, the transient state estimated period T is obtained by actually monitoring the gate current $I_G$. Therefore, if the threshold state maintaining period t varies with the value of the gate voltage RG, the capacity of the IGBT 1 and the temperature and so forth, the transient state estimated period T may vary in response to the variation.

In consequence, like the second preferred embodiment, it becomes possible to always obtain the transient state estimated period T most adjustable to the threshold state maintaining period t, thereby insuring an overcurrent protection circuit of the IGBT having an overcurrent protection function of higher accuracy, as compared with the first preferred embodiment.

Figure 5:
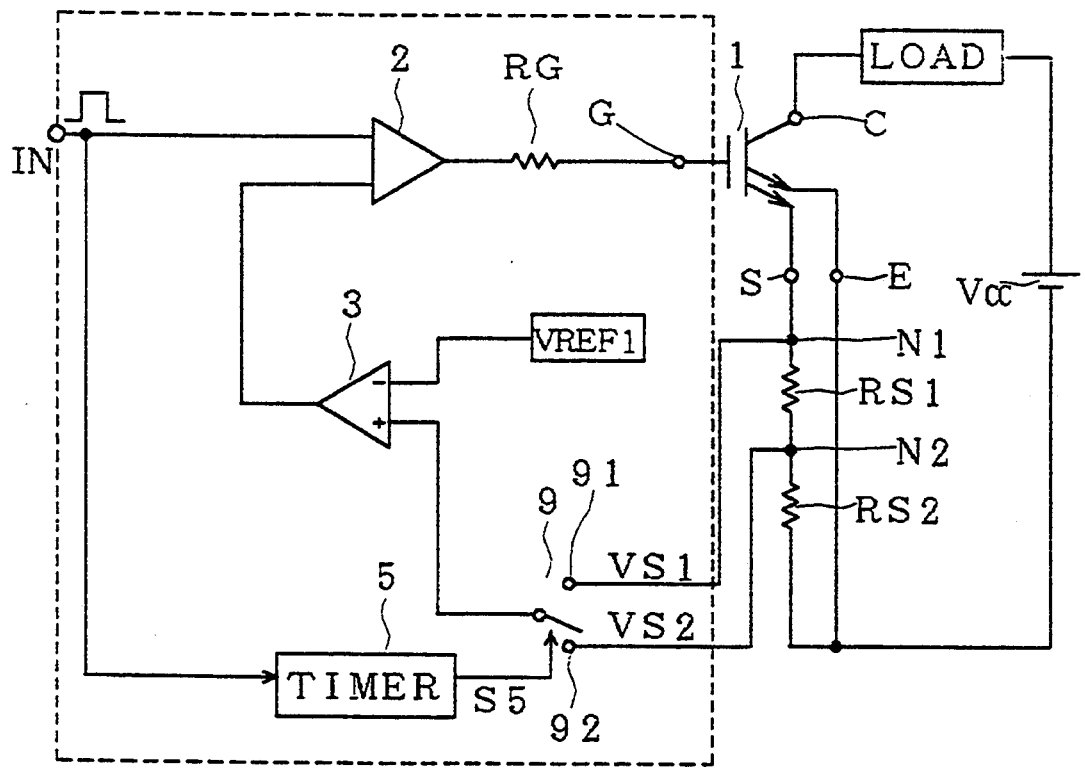
FIG. 5 is a circuit diagram showing a configuration of an overcurrent protection circuit of the IGBT in accordance with a fourth preferred embodiment of the present invention.

FIG. 5 is a circuit diagram showing a configuration of an overcurrent protection circuit of the IGBT in accordance with the fourth preferred embodiment of the present invention.

As shown in the figure, two current sensing resistances RS1 and RS2 are connected in series between a sense (S) terminal and an emitter (E) terminal of the IGBT 1. A node N1 between the sense terminal and the current sensing resistance RS1 and anode N2 between both the current sensing resistances RS1 and RS2 are connected to the first input 91 and the second input 92 of an analog switch 9, respectively.

In other words, a voltage drop value VS1 across the current sensing resistances RS1 and RS2 is taken in to the first input 91 of the analog switch 9 while a voltage drop value VS2 across only the current sensing resistance RS2 is taken in to the second input 92 of the analog switch 9. The positive input of the comparator 3 is connected through the analog switch 9 to the node N1 or the node 2.

Furthermore, the current sensing resistances RS1 and RS2 satisfy the following relations by comparison with the current sensing resistance RS and the reference voltages VREF1 and VREF2 of the first preferred embodiment:

$$RS = RS1 + RS2 \qquad (I)$$

$$VREF1/VREF2 = RS2/(RS1 + RS2) \qquad (II)$$

The timer 5 takes in an input signal IN, and is triggered by the leading edge of the input signal IN to output the control signal S5 directing the analog switch 9 to connect with the node N2 only during the transient state estimated period T in which the IGBT 1 is regarded as in a transient state immediately after its turn-on. Other than in the transient state estimated period T, when the IGBT 1 is regarded as in a stationary state, the timer 5 outputs the control signal S5 directing the analog switch 9 to connect with the node N1.

Further, since the other aspects of construction are the same as the first preferred embodiment, description associated therewith is omitted.

In this configuration, when the timer 5 regards the IGBT 1 as in a stationary state, the current detection thereof is conducted, like the first preferred embodiment, by the comparator 3 through comparing the voltage drop value VS1 (=VS) across the resultant resistance (=RS) of the current sensing resistances RS1 and RS2 with the reference voltage VREF1. When VS>VREF1, the output of the comparator 3 becomes H-level to be fed back to the input of the driver 2. Consequently, the L-level output of the driver 2 turns off the IGBT to break the overcurrent supply of the IGBT 1. Thus, the IGBT 1 can be protected from falling into a latch-up condition.

On the other hand, when the timer 5 regards the IGBT 1 as in a transient state immediately after its turn-on, the current detection thereof is conducted by the comparator 3 through comparing the voltage drop value VS2 across the current sensing resistance RS2 with the reference voltage VREF1. When VS2>VREF1, the output of the comparator 3 becomes H-level to be fed back to the input of the driver 2. Consequently, the L-level output of the driver 2 turns off the IGBT to break the overcurrent supply of the IGBT 1. Thus, the IGBT 1 can be protected from falling into a latch-up condition.

In this case, since the relation VS2=(VREF1/-VREF2)·VS1 holds, the comparison result of the voltage drop value VS2 and the reference voltage VREF1 is equal to that of the voltage drop value VS and the reference voltage VREF2 obtained by the comparator 3 in the first preferred embodiment.

Thus, the overcurrent protection circuit of the IGBT in accordance with the fourth preferred embodiment, like the first preferred embodiment, can fulfill its overcurrent protection function accurately for the IGBT 1 even during the transition period immediately after its turn-on, by employing only the reference voltage VREF1 as a reference voltage and setting the voltage drop value VS2 developed during the transient state period at the turn-on smaller than the voltage drop value VS1 developed during a stationary state period. Moreover, the overcurrent protection operation is performed without using such a means as a filter circuit that deteriorates a signal responsivity, to thereby avoid a time-lag.

Further, the fourth preferred embodiment is an expansion of the first preferred embodiment in construction. By replacing the timer 5 of the fourth preferred embodiment with a controller 7 and adding either of the T period monitor, an expansion of the second or third preferred embodiment may be constructed.

Figure 6:
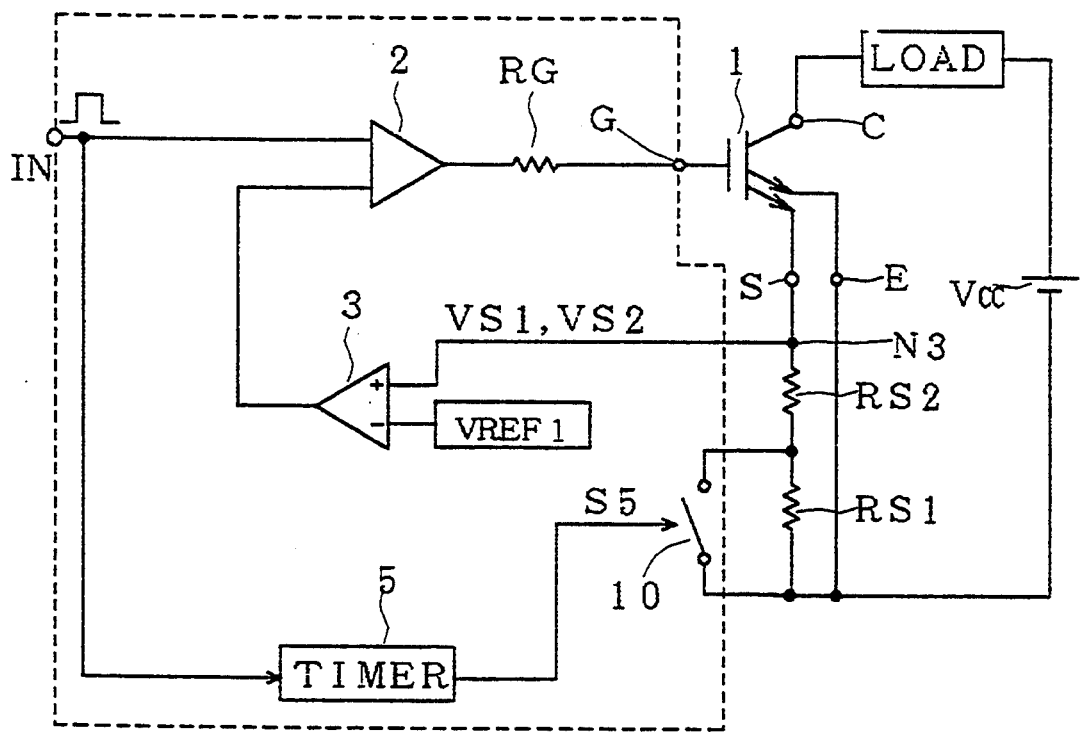
FIG. 6 is a circuit diagram showing a configuration of an overcurrent protection circuit of the IGBT in accordance with a fifth preferred embodiment of the present invention.

FIG. 6 is a circuit diagram showing a configuration of an overcurrent protection circuit of the IGBT in accordance with the fifth preferred embodiment of the present invention.

As shown in the figure, two current sensing resistances RS1 and RS2 are connected in series between a sense (S) terminal and an emitter (E) terminal of the IGBT 1. A node N3 between the sense terminal and the current sensing resistance RS2 is connected to a positive input of a comparator 3. A reference voltage VREF1 is applied to a negative input of the comparator 3.

An analog switch 10 is interposed between the both ends of the current sensing resistance RS1. The analog switch 10 receives a control signal or a one-shot pulse S5 from a timer 5 serving as a pulse generator, and it turns on or turns off depending on the control signal S5. When the analog switch 10 turns on, it short-circuits the both ends of the current sensing resistance RS1.

Furthermore, the current sensing resistances RS1 and RS2 satisfy the equations (I) and (II), like the fourth preferred embodiment, by comparison with the current sensing resistance RS and the reference voltages VREF1 and VREF2 of the first preferred embodiment.

The timer 5 receives an input signal IN, and is triggered by the leading edge of the input signal IN to output the control signal S5 directing the analog switch 10 to close only during the transient state estimated period T in which the IGBT 1 is regarded as in a transient state immediately after its turn-on. Other than in the transient state estimated period T, when the IGBT 1 is regarded as in a stationary state, the timer 5 outputs the control signal S5 directing the analog switch 10 to open.

Further, since the other aspects of construction are the same as the first preferred embodiment, description associated therewith is omitted.

In this configuration, when the timer 5 regards the IGBT 1 as in a stationary state, the current detection thereof is conducted, like the first preferred embodiment, by the comparator 3 through comparing the voltage drop value VS1 (=VS) across the resultant resistance (=RS) of the current sensing resistances RS1 and RS2 with the reference voltage VREF1. When VS>VREF1, the output of the comparator 3 becomes H-level and is fed back to the input of the driver 2. Consequently, the L-level output of the driver 2 turns off the IGBT to break the overcurrent supply of the IGBT 1. Thus, the IGBT 1 can be protected from falling into a latch-up condition.

On the other hand, when the timer 5 regards the IGBT 1 as in a transient state immediately after its turn-on, the current detection thereof is conducted by the comparator 3 through comparing the voltage drop value VS2 across the current sensing resistance RS2 with the reference voltage VREF1. When VS2>VREF1, the comparator 3 outputs a H-level signal to be fed back to the input of the driver 2. Consequently, the L-level output of the driver 2 turns off the IGBT to break the overcurrent supply of the IGBT 1. Thus, the IGBT 1 can be protected from falling into a latch-up condition.

In this case, since the relation VS2=(VREF1/-VREF2)·VS1 holds, the comparison result of the voltage drop value VS2 and the reference voltage VREF1 is equal to that of the voltage drop value VS and the reference voltage VREF2 obtained by the comparator 3 in the first preferred embodiment.

Thus, the overcurrent protection circuit of the IGBT in accordance with the fifth preferred embodiment, like the first preferred embodiment, can fulfill its overcurrent protection function accurately for the IGBT 1 even during the transition period immediately after its turn-on, by employing only a single reference voltage VREF1 as a reference voltage and setting the voltage drop value VS2 developed during the transient state period at the turn-on smaller than the voltage drop value VS1 developed during a stationary state period. Moreover, the overcurrent protection operation is performed without using such a means as a filter circuit that deteriorates a signal responsivity, to thereby avoid a time-lag.

Further, the fifth preferred embodiment is an expansion of the first preferred embodiment in construction. By replacing the timer 5 of the fifth preferred embodiment with a controller 7 and adding one of the T period monitors and so forth, an expansion of the second or third preferred embodiment may be constructed.

Figure 7:
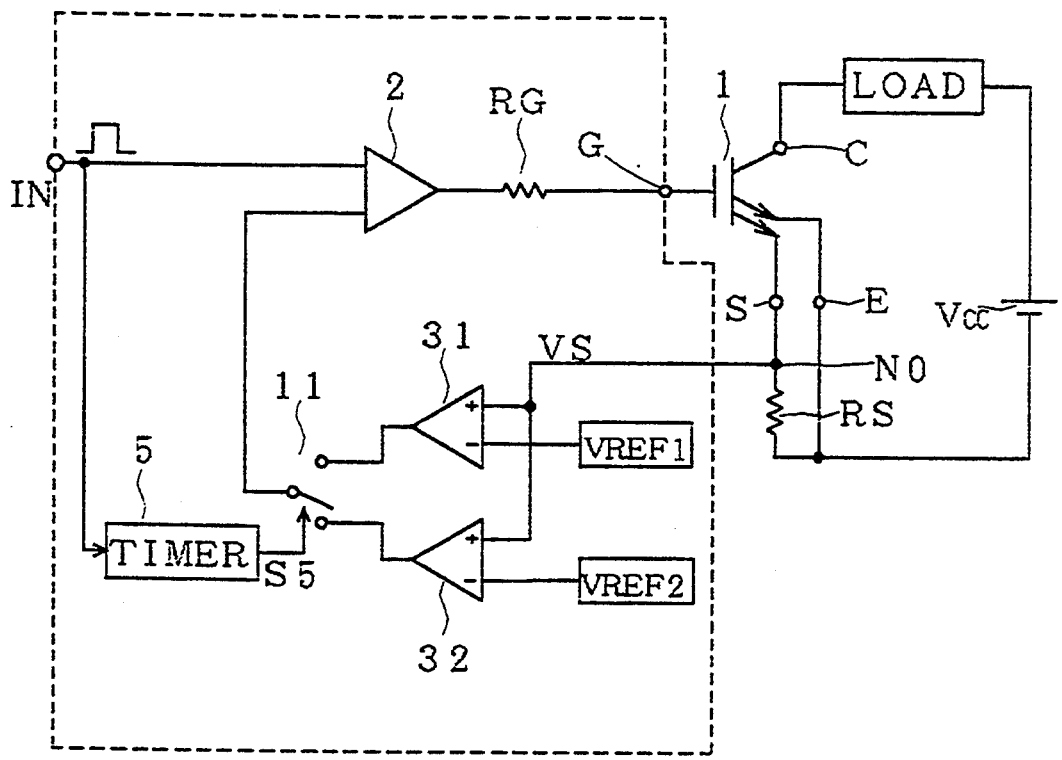
FIG. 7 is a circuit diagram showing a configuration of an overcurrent protection circuit of the IGBT in accordance with a sixth preferred embodiment of the present invention.

FIG. 7 is a circuit diagram showing a configuration of an overcurrent protection circuit of the IGBT in accordance with the sixth preferred embodiment of the present invention.

As shown in the figure, a node N0 between a sense terminal and a current sensing resistance RS of the IGBT 1 is connected to positive inputs of comparators 31 and 32, and therefore a voltage drop value VS across a current sensing resistance RS is taken in to positive inputs of the comparators 31 and 32, respectively. The comparator 31 takes in a reference voltage VREF1 through its negative input while the comparator 32 takes in a reference voltage VREF2 through its negative input.

An analog switch 11 is interposed between the comparators 31 until 32 and an input of a driver 2. The analog switch 11 receives a control signal or a one-shot pulse S5 from a timer (a pulse generator) 5, and it connects either an output of the comparator 31 or an output of the comparator 32 to the input of the driver 2 depending on the control signal S5.

The timer 5 receives an input signal IN, and is triggered by the leading edge of the input signal IN to output a control signal S5 directing the analog switch 11 to connect the output of the comparator 32 to the input of the driver 2 only during the transient state estimated period T in which the IGBT 1 is regarded as in a transient state immediately after its turn-on. Other than in the transient state estimated period T, when the IGBT 1 is regarded as in a stationary state, the timer 5 outputs a control signal S5 directing the analog switch 11 to connect the output of the comparator 31 to the input of the driver Further, since the other aspects of construction are the same as the first preferred embodiment, description associated therewith is omitted.

In this configuration, when the timer 5 regards the IGBT 1 as in a stationary state, the current detection thereof is conducted by the comparator 31 through comparing the voltage drop value VS across the current sensing resistance RS with the reference voltage VREF1. When VS>VREF1, the comparator 31 outputs an H-level to be fed back to the input of the driver 2. Consequently, the L-level output of the driver 2 turns off the IGBT to break the overcurrent supply of the IGBT 1. Thus, the IGBT 1 can be protected from falling into a latch-up condition.

On the other hand, when the timer 5 regards the IGBT 1 as in a transient state immediately after its turn-on, the current detection thereof is conducted by the comparator 32 through comparing the voltage drop value VS across the current sensing resistance RS with the reference voltage VREF2. When VS>VREF2, the comparator 32 outputs H-level to be fed back to the input of the driver 2. Consequently, the L-level output of the driver 2 turns off the IGBT to break the overcurrent supply of the IGBT 1. Thus, the IGBT 1 can be protected from falling into a latch-up condition.

Thus, the overcurrent protection circuit of the IGBT in accordance with the sixth preferred embodiment can fulfill its overcurrent protection function accurately for the IGBT 1 even during the transition period immediately after its turn-on by setting the reference voltage VREF2 used for the comparison with the voltage drop value VS during the transient state period at the turn-on larger than the reference voltage VREF1 used for the comparison with the voltage drop value VS in a stationary state. Moreover, the overcurrent protection operation is performed without using such a means as a filter circuit that deteriorates a signal responsivity, to thereby avoid a time-lag.

In the sixth preferred embodiment, the analog switch 11 switches the digital output signals of the comparators 31 and 32. Therefore, an analog signal detection of higher accuracy can be achieved since it is not needed to directly switch the analog signals of reference signals VREF1 and VREF2, as compared with the first preferred embodiment where the analog switch 4 switches analog input signals of the comparator 3.

Further, the sixth preferred embodiment is an expansion of the first preferred embodiment in construction. By replacing the timer 5 of the sixth preferred embodiment with a controller 7 and adding a T period monitor, an expansion of the second or third preferred embodiment may be constructed.

Figure 8:
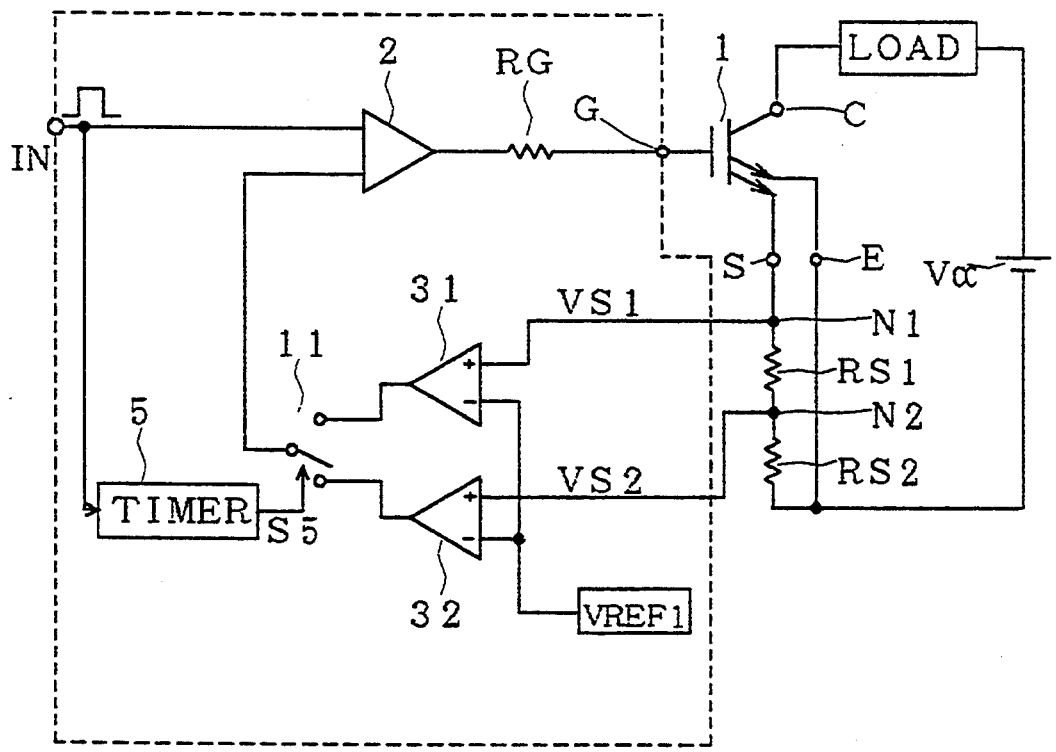
FIG. 8 is a circuit diagram showing a configuration of an overcurrent protection circuit of the IGBT in accordance with a seventh preferred embodiment of the present invention.

FIG. 8 is a circuit diagram showing a configuration of an overcurrent protection circuit of the IGBT in accordance with the seventh preferred embodiment of the present invention.

As shown in the figure, a node N1 between a sense terminal and a current sensing resistance RS1 of the IGBT 1 is connected to a positive input of a comparator 31, and therefore a voltage drop value VS1 across current sensing resistances RS1 and RS2 is fed to a positive input of the comparators 31. A node N2 between current sensing resistances RS1 and RS2 is connected to a positive input of a comparator 32, and therefore a voltage drop value VS2 across the current sensing resistance RS2 is taken in to a positive input of the comparators 32. A reference voltage VREF1 is applied in common to negative inputs of the comparators 31 and 32.

An analog switch 11 is interposed between the comparators 31 and 32 and an input of a driver 2. The analog switch 11 receives a control signal or a one-shot pulse S5 from a timer 5, and it connects either an output of the comparator 31 or an output of the comparator 32 to the input of the driver 2 depending on the control signal S5.

The timer 5 receives an input signal IN, and is triggered by the leading edge of the input signal IN to output a control signal S5 directing the analog switch 11 to connect the output of the comparator 32 to the input of the driver 2 only during the transient state estimated period T in which the IGBT 1 is regarded as in a transient state immediately after its turn-on. Out of the transient state estimated period T, when the IGBT 1 is regarded as in a stationary state, the timer 5 outputs a control signal S5 directing the analog switch 11 to connect the output of the comparator 31 to the input of the driver 2.

Further, since the other aspects of construction are the same as the fourth preferred embodiment (see FIG. 5), description associated therewith is omitted.

In this configuration, when the timer 5 regards the IGBT 1 as in a stationary state, the current detection thereof is conducted, like the fourth preferred embodiment, by the comparator 31 through comparing the voltage drop value VS1 (=VS) across the resultant resistance (=RS) of the sum of current sensing resistances RS1 and RS2 with the reference voltage VREF1. When VS>VREF1, the comparator 3 outputs an H-level to be fed back to the input of the driver 2. Consequently, the L-level output of the driver 2 turns off the IGBT to break the overcurrent supply of the IGBT 1. Thus, the IGBT 1 can be protected from falling into a latch-up condition.

On the other hand, when the timer 5 regards the IGBT 1 as in a transient state immediately after its turn-on, the current detection thereof is conducted by the comparator 32 through comparing the voltage drop value VS2 across the current sensing resistance RS2 with the reference voltage VREF1. When VS2>VREF1, the comparator 3 outputs an H-level to be fed back to the input of the driver 2. Consequently, the L-level output of the driver 2 turns off the IGBT to break the overcurrent supply of the IGBT 1. Thus, the IGBT 1 can be protected from falling into a latch-up condition.

In this case, since the relation VS2=(VREF1/VREF2)·VS1 holds, the comparison result of the voltage drop value VS2 and the reference voltage VREF1 is equal to that of the voltage drop value VS and the reference voltage VREF2 obtained by the comparator 3 in the first preferred embodiment.

Thus, the overcurrent protection circuit of the IGBT in accordance with the seventh preferred embodiment, like the fourth preferred embodiment, can fulfill its overcurrent protection function accurately for the IGBT 1 even at its turn-on, by employing only the reference voltage VREF1 as a reference voltage and setting the voltage drop value VS2 developed during the transient state period at the turn-on smaller than the voltage drop value VS1 developed during a stationary state period. Moreover, the overcurrent protection operation is performed without using such a means as a filter circuit that deteriorates a signal responsivity, to thereby avoid a time-lag.

In the seventh preferred embodiment, the analog switch 11 switches the digital output signals of the comparators 31 and 32. Therefore, an analog signal detection of higher accuracy can be achieved since it is not needed to directly switch the analog signals of voltage drop values VS1 and VS2, as compared with the fourth preferred embodiment where the analog switch 9 switches analog input signals of the comparator 3.

Figure 9:
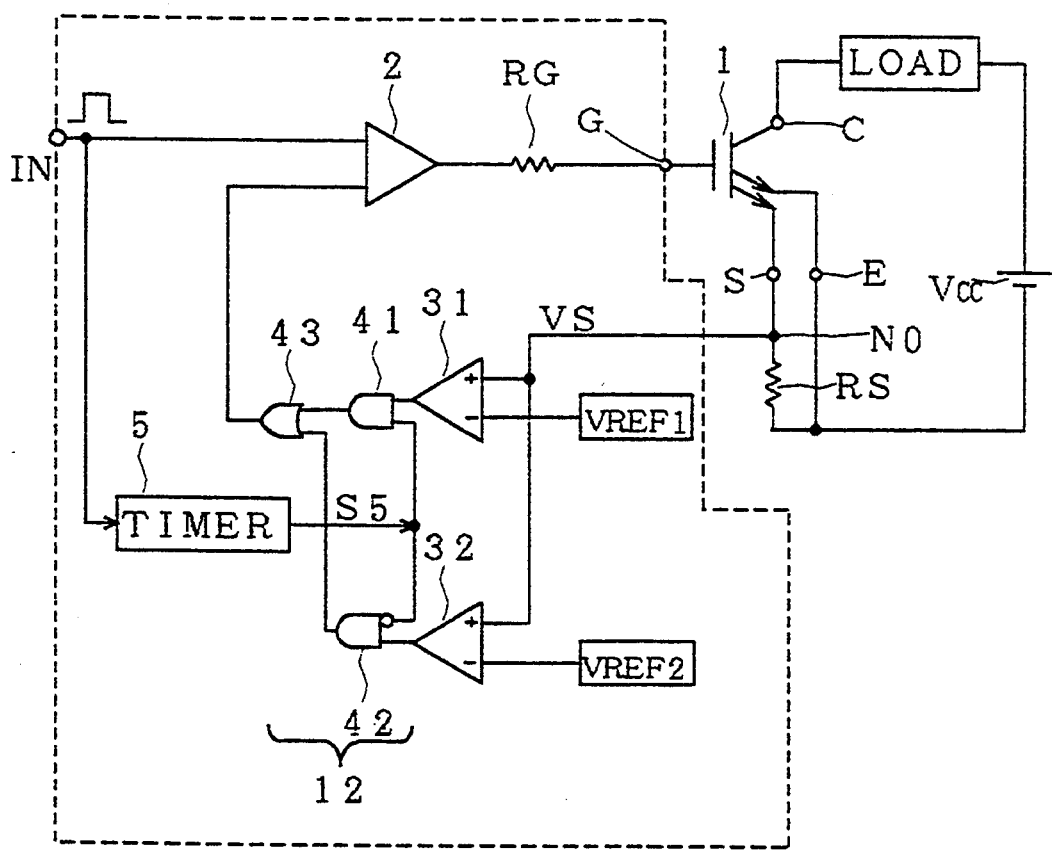
FIG. 9 is a circuit diagram showing a configuration of an overcurrent protection circuit of the IGBT in accordance with an eighth preferred embodiment of the present invention.

FIG. 9 is a circuit diagram showing a configuration of an overcurrent protection circuit of the IGBT in accordance with the eighth preferred embodiment of the present invention.

As shown in the figure, a digital switch 12 is interposed between comparators 31 and 32 and an input of a driver 2. The digital switch 12 receives a control signal or a one-shot pulse S5 from a timer 5, and it connects electrically either an output of the comparator 31 or an output of the comparator 32 to the input of the driver 2 depending on the control signal S5.

The digital switch 12 consists of AND gates 41 and 42 and an OR gate 43. The AND gate 41 receives an output of the comparator 31 through its one input and the control signal S5 from the timer 5 through the other input. The AND gate 42 receives an output of the comparator 32 through its one input and an inverted signal of the control signal S5 through the other input. The OR gate 43 receives an output of the AND gate 41 through its one input and an output of the AND gate 42 through the other input.

The timer 5 receives an input signal IN, and is triggered by the leading edge of the input signal IN to output the control signal S5 directing the digital switch 12 to connect the output of the comparator 32 to the input of the driver 2 only during the transient state estimated period T in which the IGBT 1 is regarded as in a transient state immediately after its turn-on. Other than in the transient state estimated period T, when the IGBT 1 is regarded as in a stationary state, the timer 5 outputs the control signal S5 directing the digital switch 12 to connect the output of the comparator 31 to the input of the driver 2.

Further, since the other aspects of construction are the same as the first preferred embodiment, description associated therewith is omitted.

In this configuration, when the timer 5 regards the IGBT 1 as in a stationary state, the current detection thereof is conducted by the comparator 31 through comparing the voltage drop value VS across the current sensing resistance RS with the reference voltage VREF1. When VS>VREF1, the output of the comparator 31 becomes H-level to be fed back to the input of the driver 2. Consequently, the L-level output of the driver 2 turns off the IGBT to break the overcurrent supply of the IGBT 1. Thus, the IGBT 1 can be protected from falling into a latch-up condition.

On the other hand, when the timer 5 regards the IGBT 1 as in a transient state immediately after its turn-on, the current detection thereof is conducted by the comparator 32 through comparing the voltage drop value VS across the current sensing resistance RS with the reference voltage VREF2. When VS>VREF2, the comparator 32 outputs an H-level to be fed back to the input of the driver 2. Consequently, the L-level output of the driver 2 turns off the IGBT to break the overcurrent supply of the IGBT 1. Thus, the IGBT 1 can be protected from falling into a latch-up condition.

Thus, the overcurrent protection circuit of the IGBT in accordance with the eighth preferred embodiment can fulfill its overcurrent protection function accurately for the IGBT 1 even during the transition period immediately after its turn-on by setting the reference voltage VREF2 used for the comparison with the voltage drop value VS during the transient state period at the turn-on larger than the reference voltage VREF1 used for the comparison with the voltage drop value VS in a stationary state. Moreover, the overcurrent protection operation is performed without using such a means as a filter circuit that deteriorates a signal responsivity, to thereby avoid a time-lag.

In the eighth preferred embodiment, the digital switch 12 switches the digital output signals of the comparators 31 and 32. Therefore, an analog signal detection of higher accuracy can be achieved since it is not needed to directly switch the analog signals of reference signals VREF1 and VREF2, as compared with the first preferred embodiment where the analog switch 4 switches analog input signals of the comparator 3.

In addition, because of the construction where the digital switch 12 switches the digital output signals of the comparators 31 and 32, it is advantageously allowed to be monolithically integrated with case, to operate with high speed as compared with employment of the analog switch, and so forth.

Further, the eighth preferred embodiment is an expansion of the first preferred embodiment in construction. By replacing the timer 5 of the eighth preferred embodiment with a controller 7 and adding a T period monitor, an expansion of the second or third preferred embodiment may be constructed.

Figure 10:
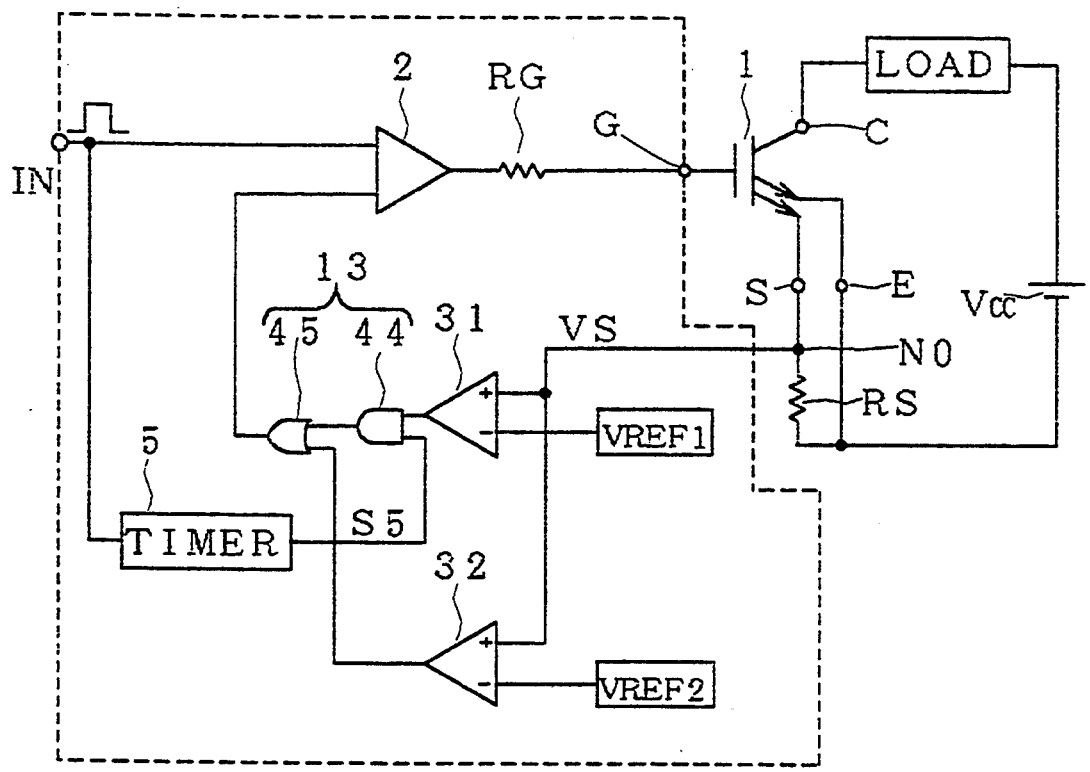
FIG. 10 is a circuit diagram showing a configuration of an overcurrent protection circuit of the IGBT in accordance with a ninth preferred embodiment of the present invention.
Figure 11:
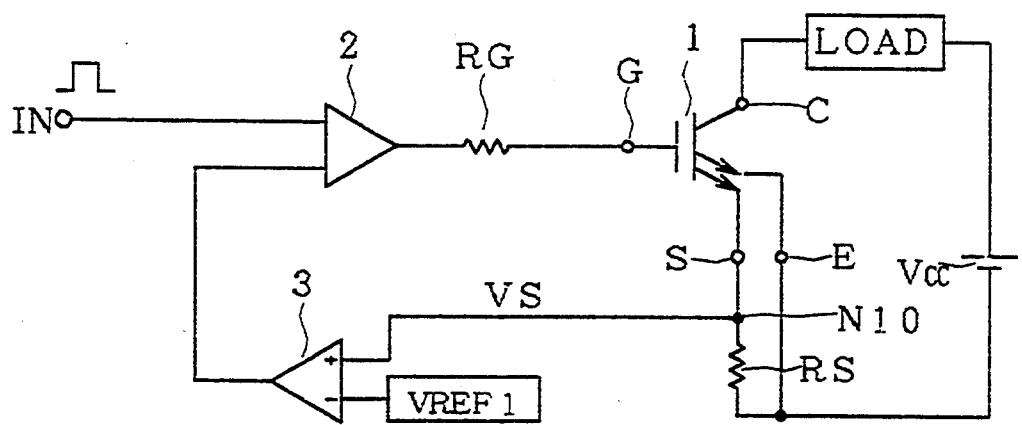
FIG. 11 is a circuit diagram showing a configuration of a conventional overcurrent protection circuit of the IGBT.
Figure 12:
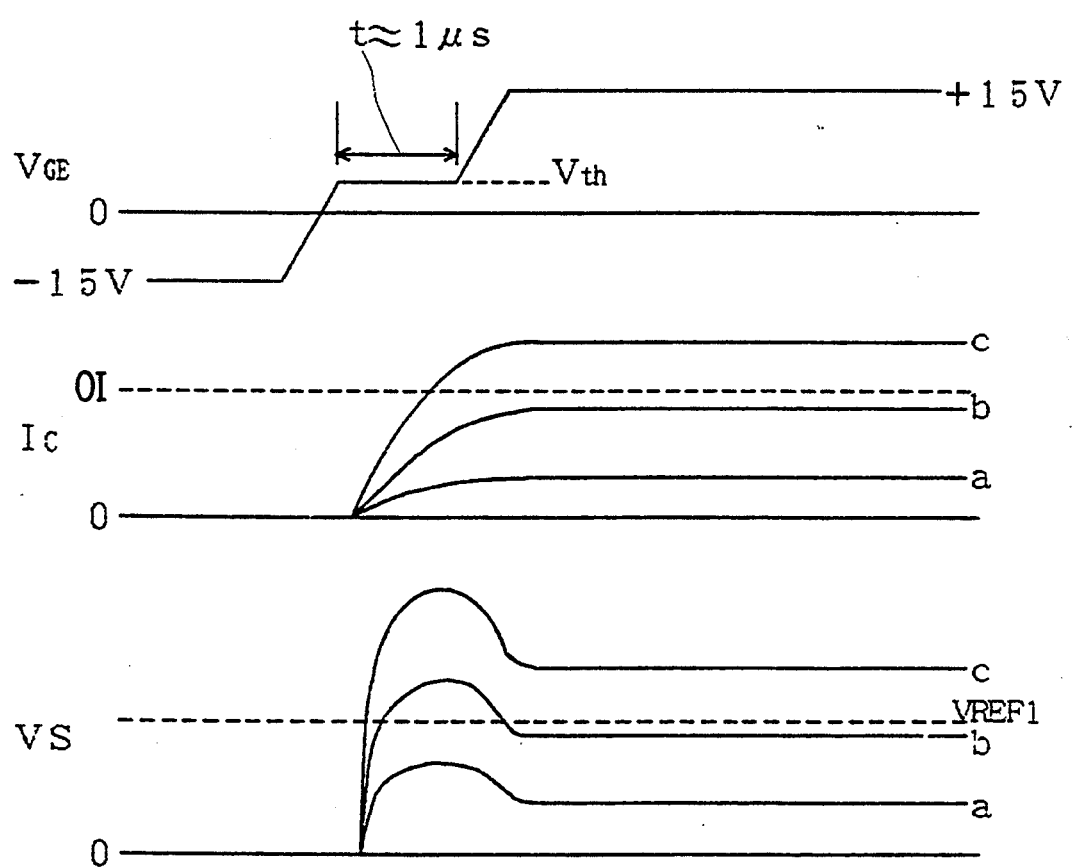
FIG. 12 shows timing charts of operations of the conventional overcurrent protection circuit of the IGBT.
Figure 13:
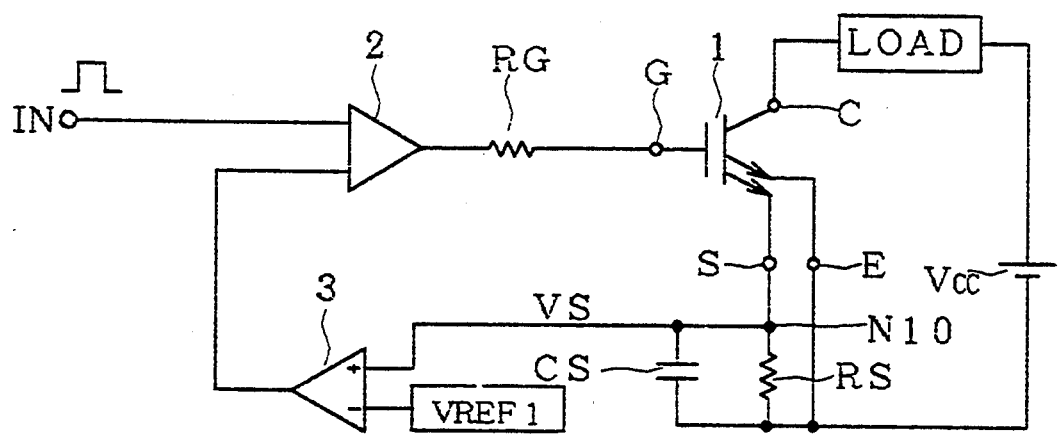
FIG. 13 is a circuit diagram showing a configuration of a conventional overcurrent protection circuit of the IGBT.

FIG. 10 is a circuit diagram showing a configuration of an overcurrent protection circuit of the IGBT in accordance with the ninth preferred embodiment of the present invention.

As shown in the figure, a digital switch 13 is interposed between comparators 31 and 32 and an input of a driver 2. The digital switch 13 receives as control signal or a one-shot pulse S5 from a timer 5, and it connects electrically either an output of the comparator 31 or an output of the comparator 32 to the input of the driver 2 depending on the control signal The digital switch 13 consists of an AND gate 44 and an OR gate 43. The AND gate 44 receives an output of the comparator 31 through its one input and the control signal S5 from the timer 5 through the other input. The OR gate 45 receives an output of the AND gate 44 through its one input and an output of the comparator 32 through the other input.

The timer 5 receives an input signal IN, and is triggered by the leading edge of the input signal IN to output the control signal S5 directing the digital switch 13 to connect the output of the comparator 32 to the input of the driver 2 only by disconnecting (outputting a L-level signal) the output of the comparator 31 using the AND gate 44 during the transient state estimated period T in which the IGBT 1 is regarded as in a transient state immediately after its turn-on. At times other than the transient state estimated period T, when the IGBT 1 is regarded as in a stationary state, the timer 5 outputs the control signal S5 directing the digital switch 13 to allow the output of the comparator 31 to be fed to the input of the driver 2.

Further, since the other aspects of construction are the same as the first preferred embodiment, description associated therewith is omitted.

In this configuration, when the timer 5 regards the IGBT 1 as in a stationary state, the current detection thereof is conducted by the comparator 31 through comparing the voltage drop value VS across the current sensing resistance RS with the reference voltage VREF1. When VS>VREF1, the output of the comparator 31 becomes H-level to be fed back to the input of driver 2. Consequently, the L-level output of the driver 2 turns off the IGBT to break the overcurrent supply of the IGBT 1. Thus, the IGBT 1 can be protected from falling into a latch-up condition.

On the other hand, when the timer 5 regards the IGBT 1 as in a transient state immediately after its turn-on, the current detection thereof is conducted the comparator 32 through comparing the voltage drop value VS across the current sensing resistance RS with the reference voltage VREF2. When VS>VREF2, the comparator 32 outputs an H-level signal to be fed back to the input of the driver 2. Consequently, the L-level output of the driver 2 turns off the IGBT to break the overcurrent supply of the IGBT 1. Thus, the IGBT 1 can be protected from falling into a latch-up condition.

Thus, the overcurrent protection circuit of the IGBT in accordance with the ninth preferred embodiment can fulfill its overcurrent protection function accurately for the IGBT 1 even at its turn-on by setting the reference voltage VREF2 used for the comparison with the voltage drop value VS during the transient state period at the turn-on larger than the reference voltage VREF1 used for the comparison with the voltage drop value VS in a stationary state. Moreover, the overcurrent protection operation is performed without using such a means as a filter circuit that deteriorates signal responsivity, to thereby avoid a time-lag.

In the ninth preferred embodiment, the analog switch 13 switches the digital output signals of the comparators 31 and 32. Therefore, an analog signal detection of higher accuracy can be achieved since it is not needed to directly switch the analog signals of reference signals VREF1 and VREF2, as compared with the first preferred embodiment where the analog switch 4 switches analog input signals of the comparator 3.

In addition, because of the construction where the digital switch 13 switches the digital output signals of the comparators 31 and 32, it is advantageously allowed to be monolithically integrated with ease, to operate with high speed as compared with employment of the analog switch, and so forth.

Further, the ninth preferred embodiment is an expansion of the first preferred embodiment in construction. By replacing the timer 5 of the ninth preferred embodiment with a controller 7 and adding a T period monitor, an expansion of the second or third preferred embodiment may be constructed.

Furthermore, although an example of the N-channel IGBT was given in the above preferred embodiments, the present invention is not limited to this but is applicable to every power device incorporating a current sensing electrode, such as a P-channel IGBT, a power MOSFET and the like.

In the first to ninth preferred embodiments, the overcurrent control circuit (enclosed by a broken line in FIGS. 1 and 3 to 10) other than the IGBT 1, the load LOAD, the current sensing resistance RS and the power supply $V_{cc}$ can monolithically integrated with relative ease. In particular, the configurations of FIGS. 9 and 10 are more applicable to monolithic integration since the signal switch thereof is a digital switch.

In the fourth preferred embodiment (see FIG. 5), the fifth preferred embodiment (see FIG. 6) and the seventh preferred embodiment (see FIG. 8), the detection of overcurrent condition of the IGBT 1 is carried out by changing the voltage drop value across the current sensing resistance depending on whether it is in transition period immediately after the turn-on or not. Therefore, in the case of monolithic integration of the portion enclosed by the broken line, the change of the type of IGBT is accompanied by only changing the resistance values of the external current sensing resistances RS1 and RS2 so that the detection of the overcurrent condition may be conducted under the optimum condition. In other word, in case of monolithic integration, the overcurrent protection can be also easily performed in an optimum way for a plurality of sorts of IGBTs.

On the other hand, in the first to third, sixth, eighth and ninth preferred embodiments, the detection of overcurrent condition of the IGBT 1 is carried out by changing the reference voltage which is internally generated depending on whether it is in transition period immediately after the turn-on or not. Therefore, in the case of monolithic integration of the portion enclosed by the broken line, the change of the sort of IGBT can not accompanied by changing the reference voltages VREF1 and VREF2. In other word, in case of monolithic integration, it is impossible to perform the overcurrent protection in an optimum way for a plurality of sorts of IGBTs.

Depending on the capacity of the IGBT 1, monolithic integration of the overcurrent control circuit and the IGBT 1 may be achieved.

While the invention has been shown and described in detail, the foregoing description is in all aspects illustrative and not restrictive. It is therefore understood that numerous modifications and variations can be devised without departing the scope of the invention.

We claim:

1. A circuit for protecting a power device from overcurrent, said power device having a sensing electrode from which a sensing signal related to a main current flowing through a main current path of said power device is obtained, said circuit comprising:
    driver means for receiving an input signal to generate a control signal and for supplying said control signal to a control electrode of said power device;
    reference signal generator means for generating first and second reference signals, a level of said second reference signal being higher than a level of said first reference signal;
    pulse generator means for generating a pulse in response to activation of said input signal;
    selector means for selecting one of said second and first reference signals in response to activation and inactivation of said pulse, respectively, to obtain a selected reference signal; and comparator means for comparing said sensing signal with said selected reference signal to generate a drive control signal which is supplied to said driver means to disable said driver means.

2. The circuit of claim 1, wherein:
said pulse generator means comprises:
means for activating said pulse in response to activation of said input signal; and
timer means for starting a time count in response to said activation of said input signal and for inactivating said pulse when said time count reaches a predetermined time period value.

3. The circuit of claim 1, wherein said pulse generator means comprises:
means for activating said pulse in response to activation of said input signal; and
means for detecting said control signal;
means for generating a third reference signal; and
means for comparing said control signal and said third reference signal to inactivate said pulse.

4. The circuit of claim 3, wherein:
said means for detecting said control signal comprises:
means for detecting a voltage of said control signal.

5. The circuit of claim 3, wherein:
said means for detecting said control signal comprises:
current detecting means for detecting a current of said control signal.

6. The circuit of claim 1, wherein:
said driver means, said pulse generator means, said selector means and said comparator means are monolithically integrated on one chip.

7. A circuit for protecting a power device from overcurrent, said power device having a sensing electrode from which a sensing signal related to a main current flowing through a main current path of said power device is obtained, said circuit comprising:
driver means for receiving an input signal to generate a control signal and for supplying said control signal to a control electrode of said power device;
pulse generator means for generating a pulse in response to activation of said input signal;
converter means operable to convert said sensing signal into one of first and second objective signals in response to said pulse to obtain a selected objective signal, respectively, a level of said second objective signal being lower than a level of said first objective signal;
reference signal generator means for generating a reference signal; and
comparator means for comparing said selected objective signal with said reference signal to generate a drive control signal which is supplied to said driver means to disable said driver means.

8. The circuit of claim 7, wherein:
said pulse generator means comprises:
means for activating said pulse in response to activation of said input signal; and
timer means for starting a time count in response to said activation of said input signal and for inactivating said pulse when said time count reaches a predetermined time period value.

9. The circuit of claim 8, wherein:
said converter means comprises:
means for converting said sensing signal into said first and second objective signal; and means for selecting said one of said first and second objective signals in response to said activation and said inactivation of said pulse, respectively, to obtain said selected objective signal.

10. The circuit of claim 8, wherein:
said converter means comprises:
a series connection of resistance means connected between said sensing electrode and a constant voltage level; and
means for short-circuiting a part of said series connection of resistance means in response to said pulse; and
means coupled to said sensing electrode to obtain one of said first and second objective signals as said selected objective signal.

11. The circuit of claim 7, wherein:
said driver means, said pulse generator means, said converter means and said comparator means are monolithically integrated.

12. A circuit for protecting a power device from overcurrent, said power device having a sensing electrode from which a sensing signal related to a main current flowing through a main current path of said power device is obtained, said circuit comprising:
driver means for receiving an input signal to generate a control signal and for supplying said control signal to a control electrode of said power device;
pulse generator means for generating a pulse in response to activation of said input signal;
reference signal generator means for generating first and second reference signals, a level of said second reference signal being higher than a level of said first reference signal;
first and second comparator means for comparing said sensing signal with said first and second reference signals, respectively; and
selector means for selecting one of outputs of said first and second comparator means in response to said pulse to generate a drive control signal which is supplied to said driver means to disable said driver means;
wherein said pulse generator means comprises:
means for activating said pulse in response to activation of said input signal; and
timer means for starting a time count in response to said activation of said input signal and for inactivating said pulse when said time count reaches a predetermined time period value; and
wherein said selector means comprises:
analog switch means for selecting one of said outputs of said first and second comparator means in response to said pulse to obtain said drive control signal.

13. A circuit for protecting a power device from overcurrent, said power device having a sensing electrode from which a sensing signal related to a main current flowing through a main current path of said power device is obtained, said circuit comprising:
driver means for receiving an input signal to generate a control signal and for supplying said control signal to a control electrode of said power device;
pulse generator means for generating a pulse in response to activation of said input signal;
converter means for converting said sensing signal into first and second objective signals, a level of said second objective signal being higher than a level of said first objective signal;

reference signal generator means for generating a reference signal;

first and second comparator means for comparing said first and second objective signals with said reference signal to output first and second output signals, respectively; and selector means for selecting one of said first and second output signals in response to said pulse to generate a drive control signal which is supplied to said driver means to disable said driver means.

14. The circuit of claim 13, wherein:
said pulse generator means comprises:

means for activating said pulse in response to activation of said input signal; and timer means for starting a time count in response to said activation of said input signal and for inactivating said pulse when said time count reaches a predetermined time period value.

15. The circuit of claim 13, wherein:
said driver means, said pulse generator means, said converter means, said first and second comparator means and said selector means are integrated on one chip.

* * * * *